United States Patent
Kinoshita et al.

(10) Patent No.: US 9,059,362 B2
(45) Date of Patent: Jun. 16, 2015

(54) LIGHT EMITTING ELEMENT, LIGHT EMITTING ELEMENT ARRAY, OPTICAL WRITING HEAD, AND IMAGE FORMING APPARATUS

(71) Applicant: FUJI XEROX CO., LTD., Minato-ku, Tokyo (JP)

(72) Inventors: Taku Kinoshita, Kanagawa (JP); Takashi Kondo, Kanagawa (JP); Kazutaka Takeda, Kanagawa (JP); Hideo Nakayama, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 32 days.

(21) Appl. No.: 13/841,513

(22) Filed: Mar. 15, 2013

(65) Prior Publication Data

US 2013/0214303 A1    Aug. 22, 2013

Related U.S. Application Data

(63) Continuation-in-part of application No. 13/403,711, filed on Feb. 23, 2012, now abandoned.

(30) Foreign Application Priority Data

Aug. 30, 2011 (JP) ................................ 2011-187294

(51) Int. Cl.
*H01L 29/06* (2006.01)
*H01L 33/14* (2010.01)
*B41J 2/45* (2006.01)
*G03G 15/04* (2006.01)
*H01L 33/00* (2010.01)

(52) U.S. Cl.
CPC . *H01L 33/14* (2013.01); *B41J 2/45* (2013.01); *G03G 15/04054* (2013.01); *H01L 33/0016* (2013.01); *H01L 33/145* (2013.01)

(58) Field of Classification Search
CPC ...................................................... H01L 33/08
See application file for complete search history.

(56) References Cited

U.S. PATENT DOCUMENTS 4,829,357 A  *  5/1989  Kasahara ..................... 257/113
5,451,977 A  *  9/1995  Kusuda et al. ................. 345/44
5,972,731 A    10/1999  Dutta (Continued)

FOREIGN PATENT DOCUMENTS

JP    1-238962 A    9/1989
JP    9-074219 A    3/1997

(Continued)

OTHER PUBLICATIONS

Office Action issued by Japanese Patent Office in corresponding Japanese Patent Application No. 2012-255026, dated Jan. 10, 2013.

(Continued)

*Primary Examiner* — Mark Tornow
(74) *Attorney, Agent, or Firm* — Sughrue Mion, PLLC

(57) ABSTRACT

A light emitting element includes a semiconductor substrate, and an island structure formed on the semiconductor substrate. The island structure includes a light-emitting-unit thyristor and a current confinement structure. The light-emitting-unit thyristor includes stacked semiconductor layers having a pnpn structure. The current confinement structure includes a high-resistance region and a conductive region, and confines carriers in the conductive region.

20 Claims, 11 Drawing Sheets

(56) References Cited

U.S. PATENT DOCUMENTS

| | | | |
|---|---|---|---|
| 2003/0071267 A1* | 4/2003 | Ohtsuka et al. | 257/88 |
| 2005/0012456 A1 | 1/2005 | Nakatsu et al. | |
| 2005/0271107 A1* | 12/2005 | Murakami et al. | 372/50.1 |
| 2009/0028563 A1* | 1/2009 | Tanigawa et al. | 398/65 |
| 2009/0121246 A1* | 5/2009 | Denbaars et al. | 257/98 |
| 2013/0049027 A1* | 2/2013 | Kinoshita et al. | 257/88 |

FOREIGN PATENT DOCUMENTS

| | | |
|---|---|---|
| JP | 09092885 A | 4/1997 |
| JP | 09127914 A | 5/1997 |
| JP | 09283792 A | 10/1997 |
| JP | 11340572 A | 10/1999 |
| JP | 11330541 A | 11/1999 |
| JP | 2001219596 A | 8/2001 |
| JP | 2001250980 A | 9/2001 |
| JP | 2001301231 A | 10/2001 |
| JP | 2002100799 A | 4/2002 |
| JP | 2003-163368 A | 6/2003 |
| JP | 2003-209282 A | 7/2003 |
| JP | 2004031669 A | 1/2004 |
| JP | 2006222342 A | 8/2006 |
| JP | 2007250958 A | 9/2007 |
| JP | 2008027949 A | 2/2008 |
| JP | 2008060227 A | 3/2008 |
| JP | 2011054754 A | 3/2011 |

OTHER PUBLICATIONS

Office Action issued by Japanese Patent Office in related Japanese Patent Application No. 2012-255018, dated Jan. 10, 2013.

Office Action issued by Japanese Patent Office in corresponding Japanese Patent Application No. 2012-255018, dated Mar. 22, 2013.

* cited by examiner

LIGHT EMITTING ELEMENT, LIGHT EMITTING ELEMENT ARRAY, OPTICAL WRITING HEAD, AND IMAGE FORMING APPARATUS

CROSS-REFERENCE TO RELATED APPLICATIONS

This application is a continuation-in-part of and claims priority under 35 USC 120 from U.S. Non-Provisional patent application Ser. No. 13/403,711 filed on Feb. 23, 2012.

This application is also based on and claims priority under 35 USC 119 from Japanese Patent Application No. 2011-187294 filed Aug. 30, 2011.

BACKGROUND (i) Technical Field

The present invention relates to a light emitting element, a light emitting element array, an optical writing head, and an image forming apparatus.

(ii) Related Art

Surface emitting element arrays are used in contact image sensors and writing heads of printers and the like. A typical surface emitting element array is implemented by integrating a linear array of light emitting elements on a single substrate. Typical examples of surface emitting elements include light-emitting diodes (LEDs), light-emitting thyristors, and laser diodes. Among them, light-emitting thyristors are devices having a pnpn structure in which compound semiconductor layers such as GaAs or AlGaAs layers are stacked and in which a driving current is applied to a gate to cause a current to flow between an anode and cathode to emit light.

SUMMARY

According to an aspect of the invention, there is provided a light emitting element including a semiconductor substrate and an island structure formed on the semiconductor substrate. The island structure includes a light-emitting-unit thyristor and a current confinement structure. The light-emitting-unit thyristor includes stacked semiconductor layers having a pnpn structure. The current confinement structure includes a high-resistance region and a conductive region, and confines carriers in the conductive region.

BRIEF DESCRIPTION OF THE DRAWINGS

Exemplary embodiment(s) of the present invention will be described in detail based on the following figures, wherein.

DETAILED DESCRIPTION

Figure 1:
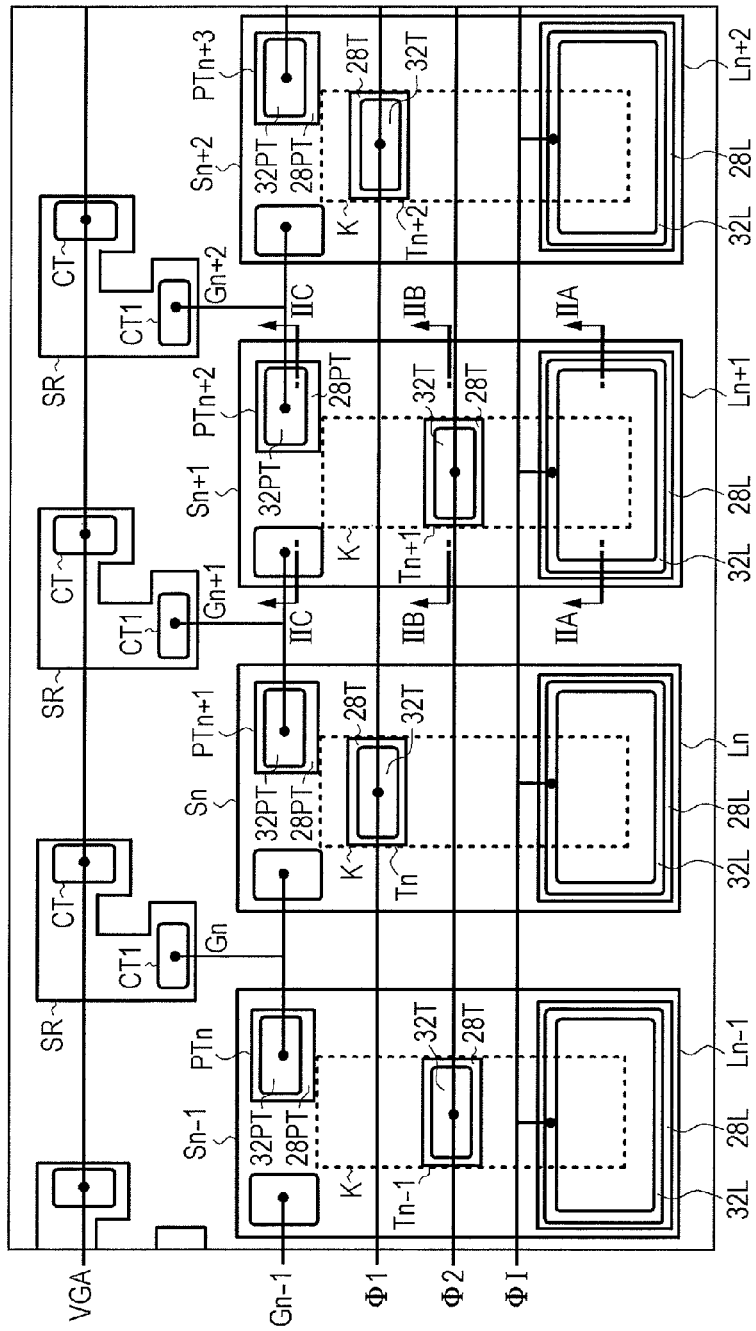
FIG. 1 is a plan view of a self-scanning light-emitting thyristor array according to a first exemplary embodiment of the present invention.

A light emitting element array in which multiple light emitting elements are integrated on a substrate may be used together with its driving circuit or the like in a light source used in a print head of an LED printer. Examples of the light emitting elements include LEDs. In a light emitting element array having a one-dimensional array of LEDs, a signal corresponding to an image signal is supplied from an external driving circuit to an individual LED, and therefore a number of bonding pads equal to the number of LEDs are mounted on the substrate in order to feed power to the respective LEDs. However, each of the bonding pads has generally a large area, which entails an increase in the area of a chip of the light emitting element array. The increase in chip area reduces the number of chips made from one wafer, leading to a limitation on the reduction in cost.

For example, a 1200 dots per inch (dpi) print head of a printer supporting A3 size has a one-dimensional array of 14,000 or more LEDs, and wires, the number of which is the same as the number of LEDs, are bonded to bonding pads. As the number of wire bonds increases, the cost required for the production of a light emitting element array increases. Additionally, the production of a high-resolution light emitting element array to increase the quality of printed images involves an increase in the number of bonding pads and therefore an increase in the number of wire bonds, resulting in an increase in chip area and cost. In addition, there is also a limitation on the layout of the bonding pads on the chip.

In a self-scanning light emitting element array in which light-emitting thyristors each having three terminals labeled anode, cathode, and gate are sequentially triggered, when the substrate is the anode, the top n layer is the cathode, and the p layer immediately below the cathode layer is the gate, no current flows between the anode and the cathode until a current greater than or equal to a threshold flows in the gate. A self-scanning light emitting device (SLED) is configured such that shifting-unit thyristors formed by arranging thyristors each having the above features in one-dimensional arrays as switching elements and light-emitting-unit thyristors formed by arranging thyristors each having the above features in one-dimensional arrays as light emitting elements are integrated on a substrate.

The SLED does not require bonding pads individually corresponding to the light-emitting thyristors. Instead, the light-emitting-unit thyristors are sequentially triggered (self-scanned) by feeding a rectangular voltage to a bonding pad on one side or either side of the chip. In the SLED, therefore, bonding pads may be put aside on the chip even in a high-resolution structure, resulting in prevention of an increase in the number of bonding pads, an increase in chip area caused by the increase in the number of bonding pads, and an increase in cost caused by an increase in the number of wire bonds.

Exemplary embodiments of the present invention will be described hereinafter with reference to the drawings. In the following exemplary embodiments, an SLED having light-emitting thyristors having a pnpn structure is used by way of example. Semiconductor layers having a pnpn structure are composed of III-V Group compound semiconductors, and GaAs, AlGaAs, and AlAs may be used as compound semiconductors in the exemplary embodiments. It is to be noted that the figures are not necessarily drawn to scale but certain dimensions have been exaggerated for clarity of illustration.

Figure 2A:
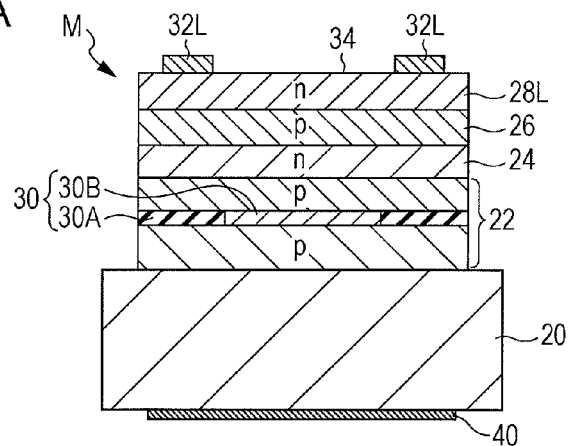
FIGS. 2A, 2B, and 2C are cross-sectional views taken along lines IIA-IIA, IIB-IIB, and IIC-IIC in FIG. 1, respectively.
Figure 2B:
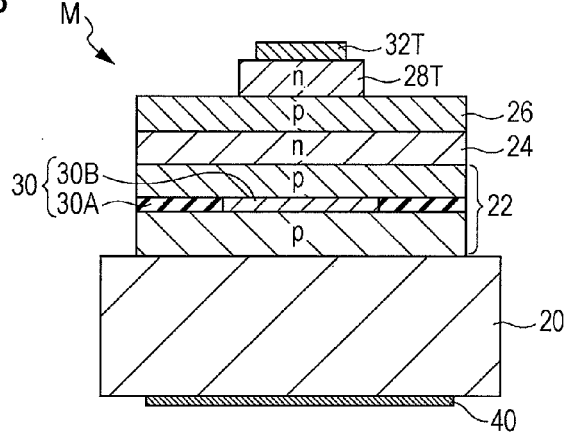
Figure 2C:
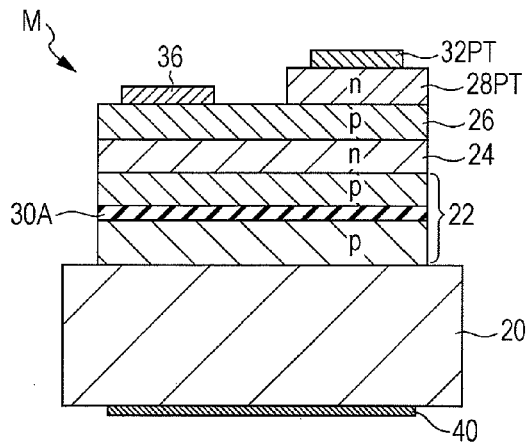
Figure 3:
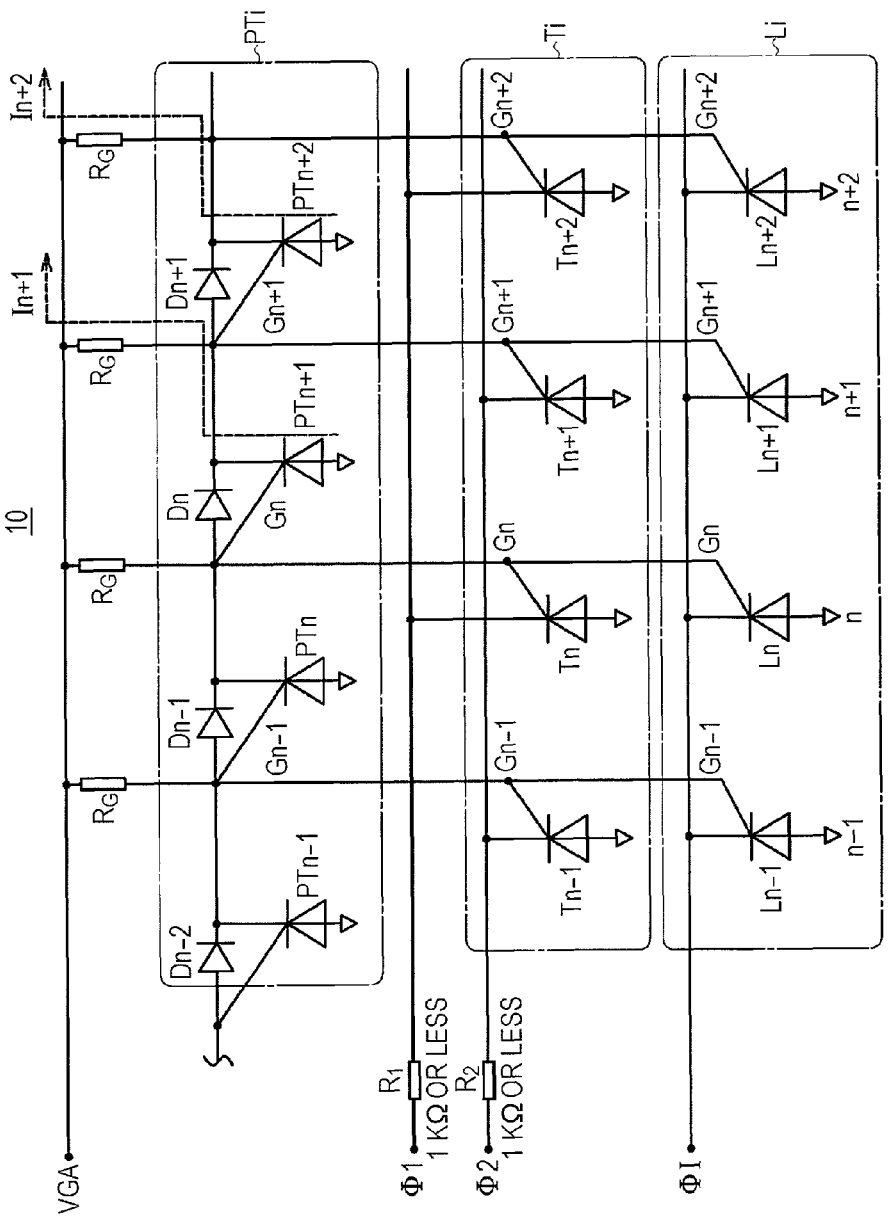
FIG. 3 illustrates an equivalent circuit of the self-scanning light-emitting thyristor array according to the first exemplary embodiment of the present invention.

FIG. 1 is a plan view of a portion of an SLED 10 according to a first exemplary embodiment of the present invention. FIGS. 2A, 2B, and 2C are cross-sectional views of one of islands of the SLED 10 illustrated in FIG. 1, taken along lines IIA-IIA, IIB-IIB, and IIC-IIC, respectively. FIG. 3 illustrates an equivalent circuit of the SLED 10 illustrated in FIG. 1.

Referring first to FIG. 3, an equivalent circuit of four light emitting elements in the SLED 10 is illustrated. The SLED 10 includes light-emitting-unit thyristors Ln−1, Ln, Ln+1, and Ln+2, shifting-unit thyristors Tn−1, Tn, Tn+1, and Tn+2, gates Gn−1, Gn, Gn+1, and Gn+2 which are shared between the light-emitting-unit thyristors Ln−1, Ln, Ln+1, and Ln+2 and the shifting-unit thyristors −1, Tn, Tn+1, and Tn+2, respectively, gate load resistors $R_G$, coupling diodes Dn−2, Dn−1, Dn, and Dn+1, parasitic thyristors PTn−1, PTn, PTn+1, and PTn+2 which are formed immediately below the cathode electrodes of the coupling diodes Dn−2, Dn−1, Dn, and Dn+1, an odd-number bit transfer line Φ1, an even-number bit transfer line Φ2, a light emission signal line ΦI, and a gate line VGA, where n is a positive integer. In the following description, the light-emitting-unit thyristors Ln−1, Ln, Ln+1, and Ln+2 are collectively referred to as the "light-emitting-unit thyristors Li" or individually referred to as the "light-emitting-unit thyristor Li"; the shifting-unit thyristors Tn−1, Tn, Tn+1, and Tn+2 are collectively referred to as the "shifting-unit thyristors Ti" or individually referred to as the "shifting-unit thyristor Ti"; and the parasitic thyristors PTn−1, PTn, PTn+1, and PTn+2 are collectively referred to as the "parasitic thyristors PTi" or individually referred to as the "parasitic thyristor PTi".

The transfer function of the SLED 10 will be briefly described. Now, it is assumed that the shifting-unit thyristor Tn is in an on state. In this case, the potential of the gate Gn of the shifting-unit thyristor Tn is increased to about −0.2 V, and a potential difference of approximately 1.5 V, which corresponds to a diffusion potential, is generated across the coupling diode Dn. Thus, Gn+1=Gn−1.5 V=−1.7 V, and Gn+2=Gn+1−1.5 V=−3.2 V.

Figure 4:
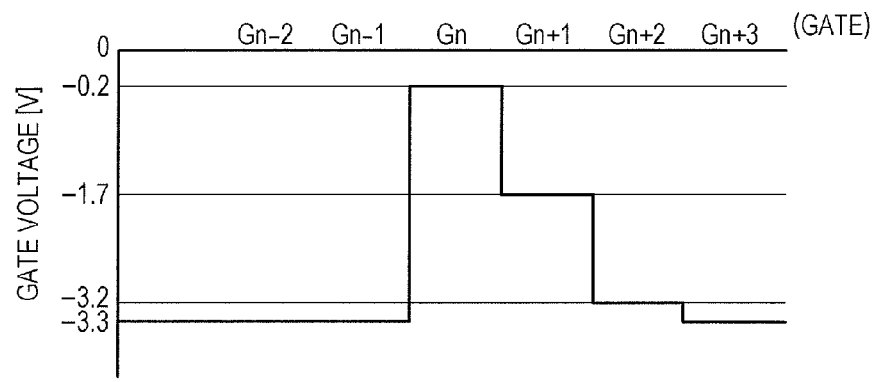
FIG. 4 illustrates a gate-to-gate potential distribution while a shifting-unit thyristor Tn is triggered.
Figure 5:
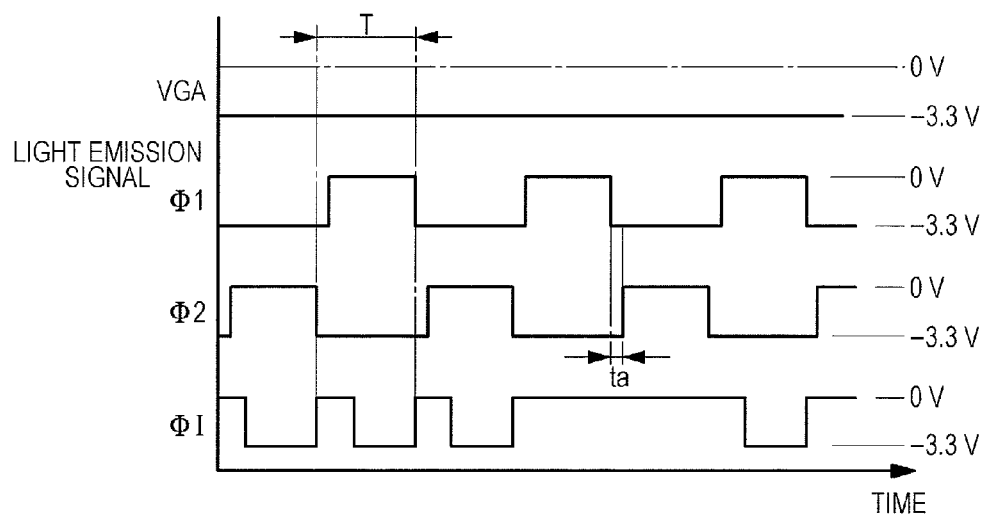
FIG. 5 illustrates a voltage waveform of a signal to be applied from the outside.

FIG. 4 illustrates a gate-to-gate potential distribution while the shifting-unit thyristor Tn is triggered. FIG. 5 illustrates a voltage waveform in the gate line VGA to be supplied to a gate, and a rectangular voltage waveform having a period T to be supplied to the odd-number bit transfer line Φ1, the even-number bit transfer line Φ2, and the light emission signal line ΦI. The time during which both the odd-number bit transfer line Φ1 and the even-number bit transfer line Φ2 are in a low level is referred to as an "overlap time", and is represented by ta.

If the voltage in the gate line VGA and the voltage to be supplied to the transfer lines Φ1, Φ2, and ΦI are −3.3 V, a voltage of about 0.1 V is applied between the gate and cathode of the shifting-unit thyristor Tn+2. In order to turn on a thyristor, at least a voltage greater than or equal to a diffusion potential is applied between the gate and cathode of the thyristor, and a current greater than or equal to a holding current is caused to flow between the cathode and anode of the thyristor. Therefore, the shifting-unit thyristor Tn+2 is not triggered. Since a reverse bias is applied to the diode Dn−1 located to the left of the gate Gn, the potential of the gate Gn−1 is equal to approximately the voltage in the gate line VGA (approximately −3.3 V). Therefore, the shifting-unit thyristor Tn−1 is not turned on. Accordingly, when the voltage to be supplied to the even-number bit transfer line Φ2 is reduced from 0 V to −3.3 V while the voltage to be supplied to the odd-number bit transfer line Φ1 is −3.3 V and the shifting-unit thyristor Tn is in an on state, only the adjacent shifting-unit thyristor Tn+1 is triggered. After that, when the voltage to be supplied to the odd-number bit transfer line Φ1 is increased to 0 V, the shifting-unit thyristor Tn is turned off, and the shifting-unit thyristor Tn+1 is now turned on.

When the shifting-unit thyristor Tn is in an on state, the potential of the gate Gn is increased to the highest voltage. Therefore, when the odd-number bit transfer line Φ1 is reduced from 0 V to −3.3 V, only the light-emitting-unit thyristor Ln is turned on to emit light. That is, the shifting-unit thyristors enter a triggered state in sequence from left to right in FIG. 3, and it is determined whether or not only a light-emitting-unit thyristor associated with a bit line for which a shifting-unit thyristor is in an on state is turned on in accordance with data "0" or "1" being input to the light emission signal line ΦI from the outside. Accordingly, the data "0" or "1" is converted into light emission information or non-light emission information.

FIG. 1 illustrates a plan view of an element array corresponding to the 4-bit elements illustrated in FIG. 3. An SLED is formed on a p-type GaAs semiconductor substrate using epitaxial growth of semiconductor layers having a pnpn structure for lattice matching with the semiconductor substrate. The semiconductor layers are etched to form an island, or mesa, corresponding to each element on the semiconductor substrate. In FIG. 1, four islands Sn−1, Sn, Sn+1, and Sn+2 are formed so as to correspond to the circuits illustrated in FIG. 3, and the islands Sn−1, Sn, Sn+1, and Sn+2 are arranged in a linear array. Each island includes a light-emitting-unit thyristor Li, a shifting-unit thyristor Ti, and a parasitic thyristor PTi disposed immediately below a coupling diode Di.

FIGS. 2A, 2B, and 2C illustrate the cross-sectional structures of the light-emitting-unit thyristor Ln+1, the shifting-unit thyristor Tn+1, and the parasitic thyristor PTn+2 immediately below the coupling diode Dn+1, respectively, which are formed in the island Sn+1. As illustrated in FIG. 2A, a p-type GaAs substrate 20 is overlaid with an anode layer 22 which includes p-type AlGaAs having a predetermined thickness and a predetermined dopant concentration, a gate layer 24 which includes n-type AlGaAs having a predetermined thickness and a predetermined dopant concentration, a gate layer 26 which includes p-type AlGaAs having a predetermined thickness and a predetermined dopant concentration, and a cathode layer 28L which includes n-type GaAs or AlGaAs having a predetermined thickness and a predetermined dopant concentration. The island Sn+1, or a mesa M, is processed in a rectangular shape by etching the semiconductor layers up to a portion of the anode layer 22 or up to the substrate 20 from the p-type gate layer 26, and the cathode layer which is the top layer of the island Sn+1 is separate for each of the light-emitting-unit thyristor Ln+1, the shifting-unit thyristor Tn+1, and the parasitic thyristor PTn+2. The cathode layer 28L of the light-emitting-unit thyristor Ln+1 is formed on the bottom side of the island Sn+1, and a cathode electrode 32L to be electrically connected to the cathode layer 28L is formed on the cathode layer 28L. The cathode electrode 32L is preferably processed in a frame shape, and a rectangular light output opening 34 through which light is output is formed in the center of the cathode electrode 32L. A common anode electrode 40 for supplying a ground potential is formed on the back surface of the substrate 20.

In the island Sn+1, a current confinement layer 30 formed of AlAs or AlGaAs having an Al composition ratio of, for example, 98% or more is provided in a portion of the anode layer 22. The current confinement layer 30 is preferably of p-type, or may be a non-doped or an n-type layer so long as there is no problem with the operation of the thyristor and, in addition, the desired amount of light emission will be reserved. The current confinement layer 30 is preferably sandwiched between AlGaAs layers having a relatively low Al composition ratio in the anode layer 22. In other words, the anode layer 22 is divided into a first anode layer and a second anode layer, and the current confinement layer 30 is interposed between the first anode layer and the second anode layer. The Al composition ratio of AlAs or AlGaAs constituting the current confinement layer 30 is considerably larger than the Al composition ratio of the other semiconductor layers 24, 26, and 28L. Thus, when the current confinement layer 30 is oxidized, a selectively oxidized region, i.e., an oxidation region 30A, and a non-oxidation region 30B are formed in the current confinement layer 30. The current confinement layer 30 may be oxidized by using, for example, water vapor oxidation annealing, and a portion of the current confinement layer 30 which is exposed on a side surface of the mesa M is oxidized. For example, when the current confinement layer 30 is oxidized from all the side surfaces of the mesa M formed in a rectangular shape illustrated in FIGS. 2A to 2C, oxidation proceeds by a predetermined distance from the side surfaces of the mesa M, and an oxidation region 30A that reflects the outline of the mesa M and a non-oxidation region 30B surrounded by the oxidation region 30A are formed. In FIG. 1, a broken line K in each island represents the boundary between the oxidation region 30A and the non-oxidation region 30B.

A position in each light-emitting thyristor at which the current confinement layer 30 is provided will now be described in more detail. The current confinement layer 30 may be formed at any of various positions such as in the cathode layer 28L, at the boundary surface between the cathode layer 28L and the p-type gate layer 26, in the p-type gate layer 26, at the boundary surface between the p-type gate layer 26 and the n-type gate layer 24, in the n-type gate layer 24, at the boundary surface between the n-type gate layer 24 and the anode layer 22, and in the anode layer 22. Here, in a case where the current confinement layer 30 is formed in the cathode layer 28L or at the boundary surface between the cathode layer 28L and the p-type gate layer 26, a threshold current flowing between the cathode layer 28L and the p-type gate layer 26, which has a gate electrode, before the thyristor is turned on is affected by the increase in the resistance value due to current confinement, and may have an adverse effect on the turn-on characteristics. Further, in a case where the current confinement layer is formed in the n-type gate layer 24, in the p-type gate layer 26, or at the boundary surface between the p-type gate layer 26 and the n-type gate layer 24, an effect of reduced light emission diameter may be expected, whereas non-light emission recombination may be induced on the interface of the formed, oxidized current confinement layer 30 so that sufficient amount of light may not be obtained. Accordingly, in this exemplary embodiment, the current confinement layer 30 is formed at the boundary surface between the n-type gate layer 24 and the anode layer 22 or in the anode layer 22, where the effect on the turn-on characteristics and the effect of non-light emission recombination are small, to form a current confinement structure. An experimental result shows that an amount of light which is approximately 1.15 times to approximately 1.25 times greater than that obtained when the current confinement layer 30 is provided at the boundary surface between the n-type gate layer 24 and the anode layer 22 is obtained when the current confinement layer 30 is provided in the anode layer 22. The reason for this may be that the amount of light emission is less affected by non-light emission recombination when the current confinement layer 30 is provided in the anode layer 22.

Accordingly, the current confinement layer 30 is preferably provided at the boundary surface between the anode layer 22 and the n-type gate layer 24 or in the anode layer 22, and is more preferably provided in the anode layer 22 from the viewpoint of the amount of light emission. If the amount of light emission is increased compared to the configuration in which no current confinement structure is provided and there is no operational failure, the current confinement layer 30 may be formed in any other position instead of at the boundary surface between the anode layer 22 and the n-type gate layer 24 or in the anode layer 22.

In this exemplary embodiment, by way of example, a semiconductor substrate is used as a substrate, and has an anode electrode on the back surface of the substrate. Alternatively, an insulating substrate may be used, and may have both an anode electrode and a cathode electrode on the light-emission surface of the substrate.

In addition, the positions of the anode electrode and the cathode electrode may be exchanged. Specifically, the current confinement layer 30 may be formed in a pnpn stack structure in which a cathode layer, a gate layer having a gate electrode, and an anode layer having an anode electrode are stacked in this order from the substrate side.

The gate electrode may be disposed in either a p-type layer or an n-type layer which is a layer located between the anode layer and the cathode layer.

In addition, a pnpn stack structure in which an anode layer, a gate layer, and a cathode layer are stacked in this order may have any other layer between the layers or in each of the layers.

The non-oxidation region 30B overlaps the cathode layer 28L of the light-emitting-unit thyristor Ln directly below the cathode layer 28L. The term "overlap", as used here, means that the cathode layer 28L overlies the non-oxidation region 30B when viewed in projection from directly above the substrate. The cathode layer 28L may overlap the entirety of the non-oxidation region 30B and overlap a portion of the oxidation region 30A. Preferably, the area ratio of the non-oxidation region 30B to the cathode layer 28L when the cathode layer 28L and the non-oxidation region 30B overlaps is larger than the area ratio of the oxidation region 30A to the cathode layer 28L when the cathode layer 28L and the oxidation region 30A overlap. The oxidation region 30A may be an electrically high resistance region, and the non-oxidation region 30B may be a conductive region. Thus, carriers (holes)

having lower mobility than electrons injected from the anode electrode 40 are confined in the non-oxidation region 30B, and are injected to the n-type gate layer 24 in a high-density state. As illustrated in FIG. 2A, since the oxidation region 30A is formed along the outer periphery of the mesa M, the carriers may be suppressed from being trapped at a surface level of the side surfaces of the mesa M and leakage current may be suppressed. As a result, the probability of recombination of holes and electrons in the gate layers 24 and 26 may be increased, and light emission efficiency may be improved, resulting in high output power.

As illustrated in FIG. 2B, the shifting-unit thyristor Tn+1 shares the semiconductor layers 22, 24, and 26 with the light-emitting-unit thyristor Ln+1, and has a top cathode layer 28T separate from the cathode layer 28L of the light-emitting-unit thyristor Ln+1. Here, the cathode layer 28T may be formed in a rectangular shape substantially at the center of the island Sn+1, and a rectangular cathode electrode 32T is formed on the cathode layer 28T. The non-oxidation region 30B of the current confinement layer 30 overlaps the cathode layer 28T directly below the cathode layer 28T. More preferably, the oxidation region 30A is not formed directly below the cathode layer 28T. The oxidation region 30A formed directly below the cathode layer 28T may increase the resistance between the anode and cathode, which is not preferable. For this reason, the cathode layer 28T is located so as to overlap the non-oxidation region 30B to prevent the oxidation region 30A of the current confinement layer 30 from having an influence on the shifting-unit thyristor Tn+1.

The coupling diode Dn+1 is formed on an upper portion of the island Sn+1. As illustrated in FIG. 2C, the coupling diode Dn+1 is formed by a PN junction of the gate layer 26 and a cathode layer 28PT. The anode of the coupling diode Dn+1 is connected to the gate Gn+1 which is shared between the light-emitting-unit thyristor Ln+1 and the shifting-unit thyristor Tn+1. Since the n-type gate layer 24 and the p-type anode layer 22 are further formed immediately below the coupling diode Dn+1, the parasitic thyristor PTn+2 having a pnpn structure is formed here. The oxidation region 30A overlaps the cathode layer 28PT of the parasitic thyristor PTn+2 directly below the cathode layer 28PT. More preferably, the oxidation region 30A completely overlaps the cathode layer 28PT directly below the cathode layer 28PT. No current path is created directly below the cathode layer 28PT, thereby increasing the resistance of the parasitic thyristor PTn+2 so as to prevent the parasitic thyristor PTn+2 from being easily triggered.

The odd-number bit transfer line Φ1 is connected to the cathode electrodes 32T of the shifting-unit thyristors Tn and Tn+2 of the islands Sn and Sn+2 corresponding to odd-number bits, and the even-number bit transfer line Φ2 is connected to the cathode electrodes 32T of the shifting-unit thyristors Tn−1 and Tn+1 of the islands Sn−1 and Sn+1 corresponding to even-number bits. The light emission signal line ΦI is connected to the cathode electrodes 32L of the light-emitting-unit thyristors Ln−1, Ln, Ln+1, and Ln+2. Islands SR to be connected to the gate line VGA are also formed on the substrate. The gate line VGA is electrically connected to p-type gate layers 26 of the islands SR via contact electrodes CT, and the gate load resistors $R_G$ are formed using the p-type gate layers 26. Output ends of the gate load resistors $R_G$ are connected to the common gate electrodes via contacts CT1, and are also connected to the cathode electrodes 32PT of the adjacent coupling diodes.

The top n-type cathode layers of the light-emitting-unit thyristor Li, the shifting-unit thyristor Ti, and the parasitic thyristor PTi have different sizes, and have different distances from a side surface of the mesas on which the current confinement layer 30 is exposed. Thus, the area ratio of the oxidation region 30A in the current confinement layer 30 to the cathode layer (area ratio of the oxidation region to the cathode layer when the cathode layer and the oxidation region overlaps) differs depending on the position of each thyristor. Preferably, in the parasitic thyristor PTi, the oxidation region 30A overlaps substantially an entirety of the cathode layer directly below the cathode layer. In order to turn on the parasitic thyristor PTi, the carriers flow through a current path that bypasses the oxidation region 30A, and the resistance value is increased accordingly.

In contrast, in the shifting-unit thyristor Ti, preferably, the oxidation region 30A does not overlap substantially an entirety of the cathode layer directly below the cathode layer. Like a conventional structure having no current confinement layer 30, no differences in the switching operation may occur. In addition, even when the light-emitting-unit thyristor Li is oxidized from three side surfaces of the rectangular island, only a peripheral portion of the cathode layer overlaps the oxidation region 30A while the remaining center portion of the cathode layer remains as the non-oxidation region 30B directly below the cathode layer. Thus, substantially no problem with the light emission operation occurs. Additionally, the current confinement structure allows the carriers to be concentrated to the center of the light emitting unit. Thus, non-light emission recombination may be suppressed at an interface level of the side surfaces of the mesa, resulting in high output power of the light-emitting thyristors.

In this exemplary embodiment, therefore, the island including the light-emitting-unit thyristor Li, the shifting-unit thyristor Ti, and the coupling diode Di has a current confinement structure, thus preventing the parasitic thyristor PTi directly below the cathodes of the coupling diode Di from being triggered during the self-scanning operation, without changing the self-scanning function, by increasing the time constant of the cathode potential drop of the parasitic thyristor PTi. The output power of the light-emitting-unit thyristors Li may also be increased without reducing the switching speed of the shifting-unit thyristors Ti.

Figure 6A:
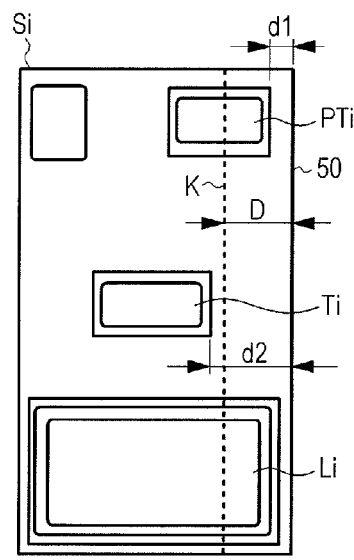
FIGS. 6A to 6D illustrate other oxidation methods according to the first exemplary embodiment of the present invention.

In the foregoing example, a current confinement layer is oxidized from the four sides of a rectangular mesa M. However, the present invention is not limited to this example, and any other oxidation method may be used. FIGS. 6A to 6D illustrate, by way of example, one island Si including a light-emitting-unit thyristor Li, a shifting-unit thyristor Ti, and a parasitic thyristor PTi. FIG. 6A illustrates an example in which the current confinement layer 30 is oxidized from only a side surface 50 of the island Si. If the distance from the edge of the cathode layer of the parasitic thyristor PTi to the side surface 50 is represented by d1 and the distance from the edge of the cathode layer of the shifting-unit thyristor Ti to the side surface 50 is represented by d2, the oxidation distance D of the oxidation region 30A from the side surface 50 satisfies d1<D≤d2, more preferably, D≅d2. Therefore, the on resistance of the parasitic thyristor PTi may be increased and the switching speed may be maintained without increasing the on resistance of the shifting-unit thyristor Ti. In the light-emitting-unit thyristor Li, furthermore, carriers that do not contribute to light emission may be suppressed from being trapped in the side surface 50.

Figure 6B:
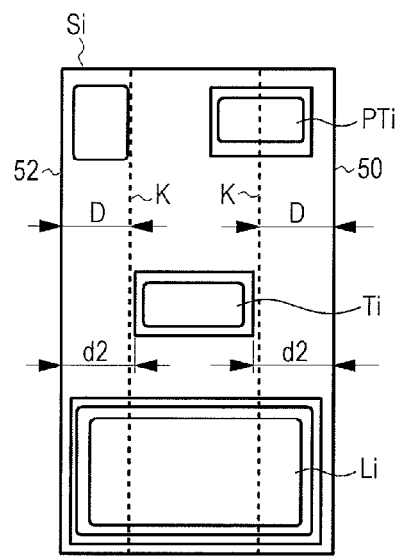

FIG. 6B illustrates an example in which the current confinement layer 30 is simultaneously oxidized from two facing side surfaces 50 and 52 of the island Si. Also in this case, the oxidation distance D of the oxidation region 30A is preferably less than or equal to the distance d2 of the cathode layer of the shifting-unit thyristor Ti (D≤d2). The simultaneous oxidation may reduce the oxidation time. In the light-emitting-unit thyristor Li, furthermore, compared to the example illustrated in FIG. 6A, carriers may be confined in the center.

Figure 6C:
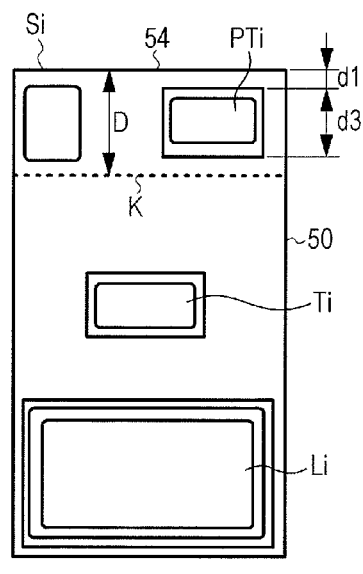

FIG. 6C illustrates an example in which the current confinement layer 30 is oxidized from a side surface 54 in an upper portion of the island S1. If the distance from the edge of the cathode layer of the parasitic thyristor PTi to the side surface 54 is represented by d1 and the width of the cathode layer in the direction extending to the side surface 50 is represented by d3, the oxidation distance D of the oxidation region 30A from the side surface 54 preferably satisfies D≥d1+d3. Therefore, the on resistance of the parasitic thyristor PTi may be increased.

Figure 6D:
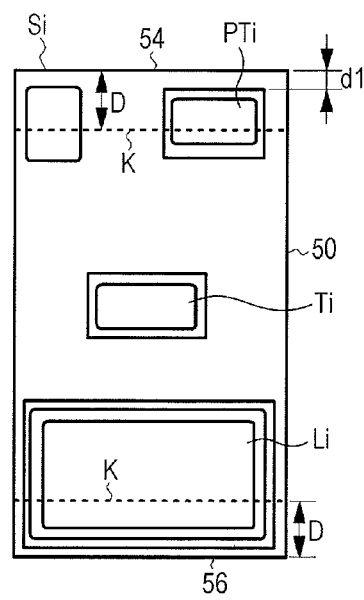

FIG. 6D illustrates an example in which the current confinement layer 30 is oxidized from two sides of the island Si, e.g., the side surface 54 and a side surface 56 facing the side surface 54. In this case, the oxidation distance D of the oxidation region 30A is larger than at least the distance d1 of the edge of the cathode layer of the parasitic thyristor PTi from the side surface 54. Since the oxidation region 30A is formed from the side surface 56 toward the light-emitting thyristor Li, the upper limit of the oxidation distance D is determined within a range that allows improvement in the optical output power of the light-emitting-unit thyristor Li, compared to the case where the current confinement layer 30 is not formed.

Although not illustrated in the drawings, the current confinement layer 30 may be simultaneously oxidized from three side surfaces of the island Si. For example, the current confinement layer 30 may be simultaneously oxidized from the side surfaces 50, 52, and 54. The current confinement layer 30 is exposed on the side surface or surfaces of the mesa M in order to oxidize the current confinement layer 30. Therefore, the mesa M may be etched in a side surface to be oxidized to the depth that reaches the current confinement layer 30.

In the foregoing example, the current confinement layer 30 is formed in the anode layer 22, by way of example. However, the current confinement layer 30 may be formed in a different position. For example, the current confinement layer 30 may be formed in the boundary between the n-type gate layer 24 and the anode layer 22. In this exemplary embodiment, furthermore, the island Si is formed in a rectangular shape in plan view. However, this is merely an example, and any other shape, for example, a circular shape, an elliptical shape, a trapezoidal shape, or a polygonal shape, may be used.

Next, a second exemplary embodiment of the present invention will be described. In the first exemplary embodiment, a current confinement layer is oxidized from a side surface of an island (or mesa). In the second exemplary embodiment, a groove is formed near a parasitic thyristor by etching to form a high-resistance region between the anode and cathode of the parasitic thyristor.

Figure 7A:
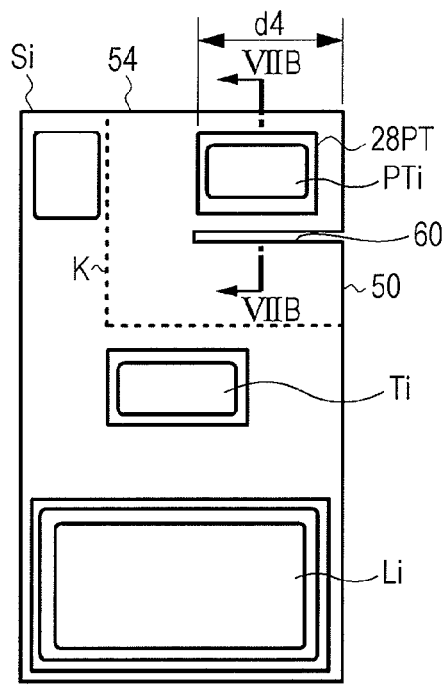
FIG. 7A is a plan view of a self-scanning light-emitting thyristor array according to a second exemplary embodiment of the present invention.
Figure 7B:
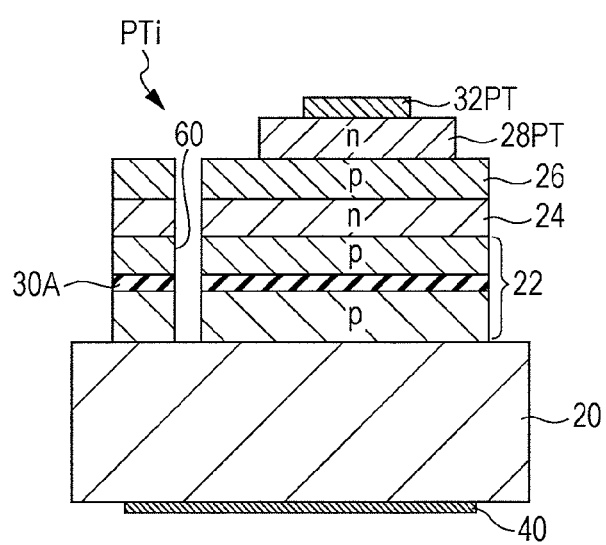
FIG. 7B is a cross-sectional view taken along line VIIB-VIIB in FIG. 7A.

FIG. 7A is a plan view of one island to be used in an SLED according to the second exemplary embodiment, and FIG. 7B is a cross-sectional view taken along line VIIB-VIIB in FIG. 7A. In the second exemplary embodiment, an island Si including a light-emitting-unit thyristor Li, a shifting-unit thyristor Ti, and a parasitic thyristor PTi has one elongated groove 60 formed from a side surface 50. The groove 60 is formed adjacent to the cathode layer 28PT of the parasitic thyristor PTi and extending substantially parallel to the cathode layer 28PT of the parasitic thyristor PTi. More preferably, if the distance of the cathode layer 28PT of the parasitic thyristor PTi from the side surface 50 is represented by d4, the groove 60 has a length of d4 or larger. As illustrated in FIG. 7B, the groove 60 may be formed by etching the semiconductor layers up to at least the current confinement layer 30.

In the second exemplary embodiment, the island Si is selectively oxidized using at least the groove 60. Through the oxidation, the current confinement layer 30 is oxidized inwardly from the groove 60. The oxidation region 30A has a rectangular shape as indicated by a broken line K in FIG. 7A, and is formed entirely directly below the cathode layer of the parasitic thyristor PTi by appropriately selecting the oxidation time. Thus, substantially the entirety of the current path between the anode and cathode of the parasitic thyristor PTi may be blocked by the oxidation region 30A, leading to an increase in the on resistance of the parasitic thyristor PTi. In the second exemplary embodiment, the oxidation time may be reduced by oxidizing the island Si simultaneously from the groove 60 and a side surface 54 facing the groove 60. Additionally, the island Si having the light-emitting-unit thyristor Li formed therein may be oxidized from the side surfaces 50, 52, and 56.

Next, a third exemplary embodiment of the present invention will be described. In the structures according to the first and second exemplary embodiments, the anode electrode of the coupling diode Di and the gate electrode of the shifting-unit thyristor Ti and the light-emitting-unit thyristors Li are commonly used. In the third exemplary embodiment, an anode electrode and a gate electrode are separate.

Figure 8A:
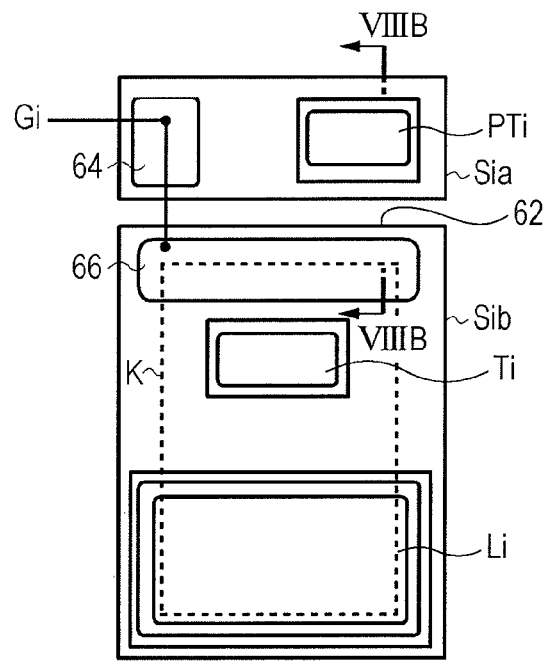
FIG. 8A is a plan view of a self-scanning light-emitting thyristor array according to a third exemplary embodiment of the present invention.
Figure 8B:
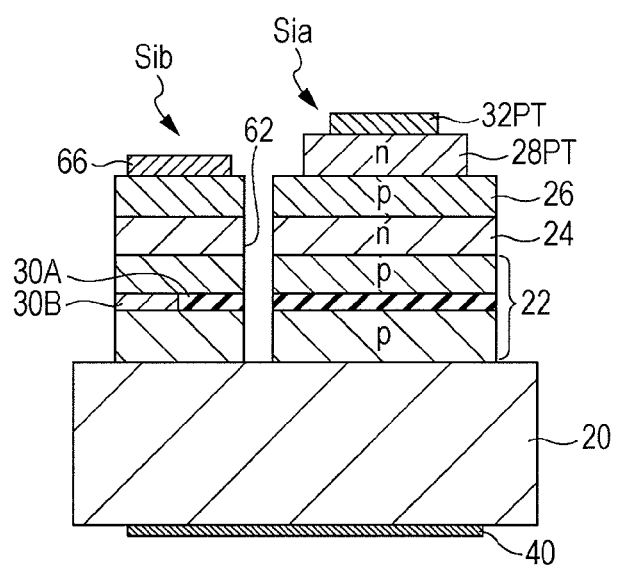
FIG. 8B is a cross-sectional view taken along line VIIIB-VIIIB in FIG. 8A.

FIG. 8A is a plan view of one island used in an SLED according to the third exemplary embodiment. As illustrated in FIGS. 8A and 8B, the island is divided into substantially two islands Sia and Sib by a groove 62. The groove 62 is formed by etching so as to have a depth that reaches at least the current confinement layer 30. The island Sia has a coupling diode Di, and the coupling diode Di has an anode electrode 64 connected to a gate Gi. The island Sib has a shifting-unit thyristor Ti, a light-emitting-unit thyristor Li, and a gate electrode 66 that is shared between the shifting-unit thyristor Ti and the light-emitting-unit thyristor Li. The gate electrode 66 is connected to the anode electrode 64.

In the third exemplary embodiment, the entirety of the current confinement layer 30 in the island Sia is oxidized. The current confinement layer 30 may be oxidized from the groove 62, or may be simultaneously oxidized from the four side surfaces of the island Sia. The current confinement layer 30 in the island Sib may be oxidized by a certain distance from the outer periphery of the island Sib. In this case, as in the first exemplary embodiment, in the shifting-unit thyristor Ti, the current confinement layer 30 directly below the cathode layer serves as a non-oxidation region, and in the light-emitting-unit thyristor Li, a portion of the periphery of the island Sib is oxidized. According to the third exemplary embodiment, the pnpn structure formed immediately below the cathode electrode of the coupling diode Di in the island Sia may be completely blocked by the oxidation region 30A of the current confinement layer 30. Therefore, the parasitic thyristor PTi is not turned on.

Next, the conditions under which the parasitic thyristor PTi is turned on will be discussed. As illustrated in FIG. 1, when the shifting-unit thyristor Tn, the light-emitting-unit thyristor Ln, and the coupling diode Dn are formed in an island having the gate Gn and when the coupling diode Dn is formed by the upper pn junction in the pnpn thyristor structure, the parasitic thyristor PTn+1 is formed immediately below the cathode electrode of the coupling diode Dn. The parasitic thyristor PTn+1 is not generally used for the transfer function but may be turned on depending on the voltage values of the gates Gn and Gn+1.

Figure 9:
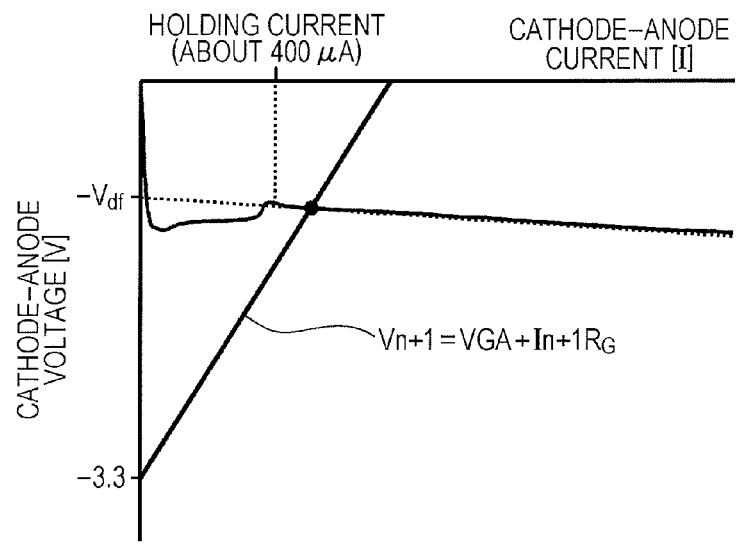
FIG. 9 illustrates an operating point analysis on a parasitic thyristor PTn+1.
Figure 10:
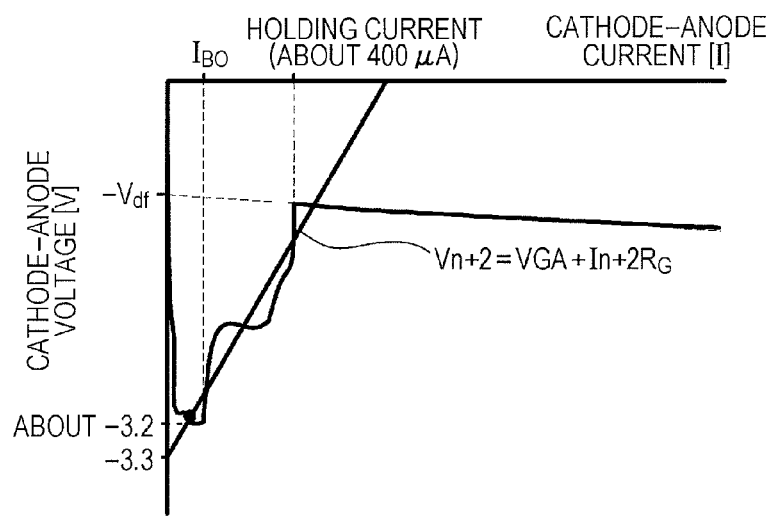
FIG. 10 illustrates an operating point analysis on a parasitic thyristor PTn+2.

Consideration will now be given of the conditions under which the parasitic thyristor PTi is turned on. Since Gn+1−Gn≅1.5 V (diffusion potential), all the thyristors PTi may be triggered in terms of voltage value. However, as illustrated in FIG. 9, the flow of a current greater than or equal to a holding current is required to trigger the parasitic thyristor PTi. If $\Phi1=\Phi2=\Phi I=VGA=-3.3$ V and the shifting-unit thyristor Tn is in an on state, the gates Gn and Gn+1 are −0.2 V and −1.7 V, respectively. In this case, from the result of the operating point analysis illustrated in FIG. 9, it is possible to trigger the parasitic thyristor PTn+1 with a gate load resistor $R_G$ of 15 kΩ. When the thyristor PTn+1 is triggered, the cathode potential Gn+1 is increased to −1.5 V. The adjacent parasitic thyristor PTn+2 has a gate potential of −1.5 V and may not be triggered according to the result of the operating point analysis illustrated in FIG. 10 (the transition from a region of a threshold current value $I_{BO}$ or less to the straight line part is not enabled). In FIGS. 9 and 10, Vn+1 and Vn+2 denote the voltages between the cathode and anode of the parasitic thyristor PTn+1 and between the cathode and anode of the parasitic thyristor PTn+2, respectively, and In+1 and In+2 denote the currents flowing in the parasitic thyristors PTn+1 and PTn+2, respectively, in directions indicated by broken-line arrows in FIG. 3.

The ON/OFF speed of the shifting-unit thyristor Ti affects the transfer speed of the SLED 10. The ON/OFF speed may be determined by the period of time from when an ON signal is received to when the cathode potential of a thyristor is reduced to a level that allows the thyristor to be triggered, and the time constant of the transient characteristics of the SLED 10 may be determined by the resistance value and the capacitance of the circuit. In order to increase the transfer speed, for example, the value of the gate load resistor $R_G$ in the current path illustrated FIG. 3 may be reduced.

Figure 11:
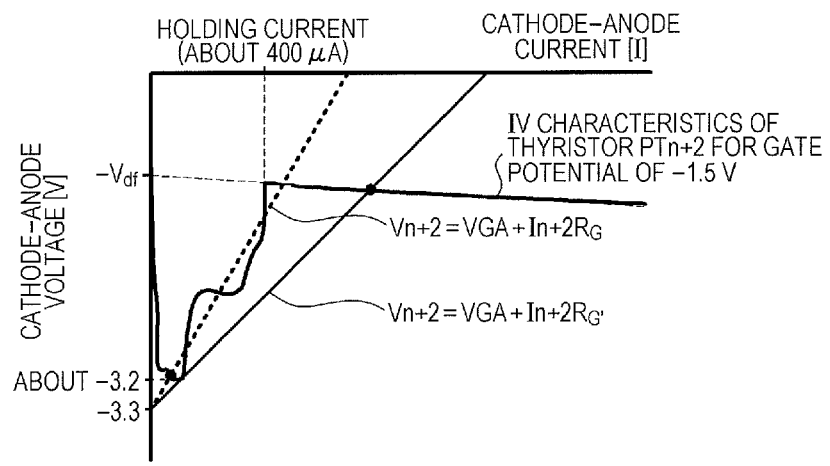
FIG. 11 illustrates an operating point analysis on the parasitic thyristor PTn+2 when the value of a gate load resistor is reduced.

However, if the value of the gate load resistor $R_G$ is reduced to a value $R_{G'}$, as may be seen from the result of the operating point analysis illustrated in FIG. 11, the operating point is positioned at a current value greater than or equal to a holding current or is positioned in a negative resistance region, and the parasitic thyristor PTn+2 is turned on. In an on state, the potential of the gate Gn+2 is increased to substantially a diffusion potential of −1.5 V. Thus, the shifting-unit thyristor Tn+2, which is two thyristors adjacent to the shifting-unit thyristor Tn that has been turned on, also satisfies the turn-on conditions. A shifting-unit thyristor Tn+2m (where m is an integer) connected to the same transfer line also performs a similar operation, and the self-scanning function in which only a thyristor adjacent to a shifting-unit thyristor which has been turned on satisfies the turn-on conditions is not achievable. For this reason, reducing the value of the gate load resistor $R_G$ to increase the transfer speed may cause transfer failure.

Figure 12:
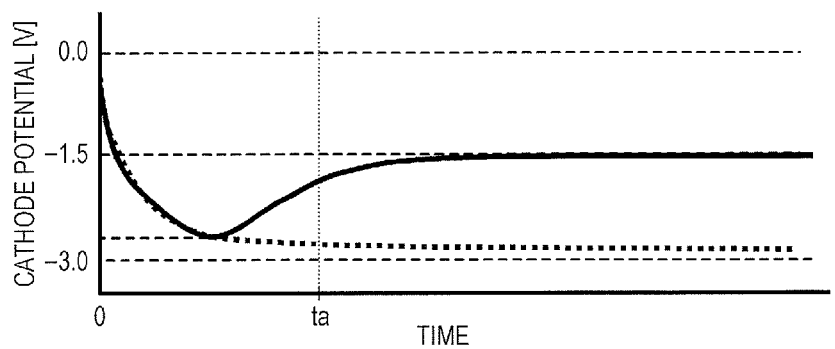
FIG. 12 illustrates the relationship between the cathode potential and the changes over time.

When the shifting-unit thyristor Tn is in an on state, the shifting-unit thyristor Tn+2, which is two thyristors adjacent to the shifting-unit thyristor Tn, may also be turned on because of the transition of the parasitic thyristor PTn+2 to an on state. In order to prevent the transition of the parasitic thyristor PTn+2, the following procedure may be proposed: First, consideration will be given of changes in cathode potential over time when the shifting-unit thyristor Tn+1 is turned on. FIG. 12 illustrates the relationship between the cathode potential and the changes over time. When the gate potential is −1.5 V, a thyristor may be triggered by setting the cathode potential of the thyristor to −3.0 V or larger. In this case, the cathode potential needs to reach −3.0 V at a time within the overlap time ta during which the preceding shifting-unit thyristor Tn is in an on state and during which the gate potential of the shifting-unit thyristor Tn+1 is kept at −1.5 V (see FIG. 12). Whether or not the cathode potential reaches −3.0 V within the overlap time ta depends on the time constant of the cathode potential drop and the voltage value applied outwardly from a resistor $R_1$ illustrated in FIG. 3. In order to prevent the transition of the parasitic thyristor PTn+2 to an on state, the time constant of the cathode potential drop of the thyristor PTi located immediately below the cathode electrode of the coupling diode Di is increased, that is, the on resistance of the parasitic thyristor PTn+2 is increased. When a resistor is to be connected in series with the parasitic thyristor PTi, the resistor is connected to any of the coupling diodes illustrated in FIG. 1; however, it may be difficult to ensure a space for placing the resistor in which a current flows laterally. The resistance value may be increased by changing the epitaxial configuration, which increases the on resistance of the light-emitting-unit thyristor Li and is not preferable because a large voltage value is required to obtain the same amount of light and power consumption is large.

The pnpn regions (portions where the top n-type layers exist) of the light-emitting-unit thyristor Li, the shifting-unit thyristor Ti, and the parasitic thyristor PTi have different sizes, and have different distances from a surface of the mesa on which a current confinement layer is exposed. Therefore, the thyristors Li, Ti, and PTi have different area ratios of an oxidized portion in the current confinement layer to the cathode layer. Since a large proportion of the pnpn structure of the parasitic thyristor PTi is covered by the oxidation region 30A, carriers are caused to flow through a current path that bypasses the oxidation region 30A to turn on the parasitic thyristor PTi. The resistance value is increased accordingly.

In this exemplary embodiment, therefore, the following difficulties may be addressed: the shifting-unit thyristors are not sequentially triggered if the value of the gate load resistor $R_G$ is reduced in order to increase the transfer operation speed, that is, when the shifting-unit thyristor Tn is in an on state, both the shifting-unit thyristor Tn+1 and the shifting-unit thyristor Tn+2, which is two thyristors adjacent to the shifting-unit thyristor Tn, are also turned on.

Figure 13:
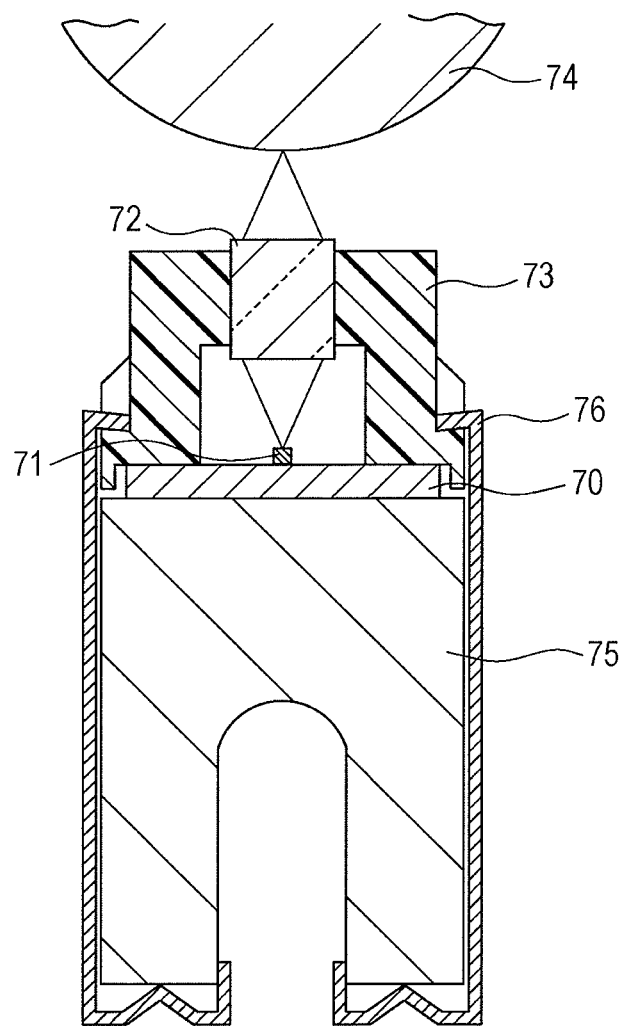
FIG. 13 illustrates an example structure of an optical writing head including an self-scanning light emitting element array according to an exemplary embodiment.

The self-scanning light emitting element array described above may be used in an optical writing head of, for example, an optical printer. FIG. 13 illustrates an example of an optical writing head including a self-scanning light emitting element array. Plural light emitting element array chips 71 each having light-emitting thyristors arranged in columns are mounted on a chip mounting substrate 70 in the main scanning direction, and an erecting equal-magnification rod lens array 72 which is long in the main scanning direction is fixed by a resin housing 73 along an optical path of light emitted from the light emitting elements of the light emitting element array chips 71. A photoconductor drum 74 is provided along the optical axis of the rod lens array 72. A heat sink 75 for dissipating heat generated by the light emitting element array chips 71 underlies the chip mounting substrate 70, and the housing 73 and the heat sink 75 are fixed by a fastening member 76 with the chip mounting substrate 70 between the housing 73 and the heat sink 75.

Figure 14:
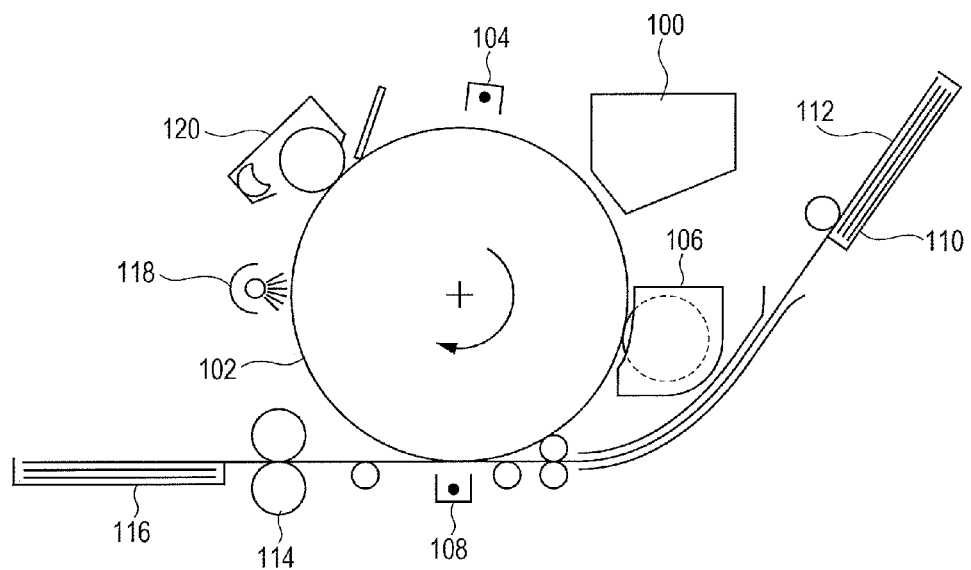
FIG. 14 illustrates an example of an optical writing head used in an optical printer and including a self-scanning light emitting element array according to an exemplary embodiment.

FIG. 14 illustrates an optical printer including the optical writing head illustrated in FIG. 13. The optical printer has an optical writing head 100. A material (photoconductor) having a photoconductivity, such as amorphous Si, is created on the surface of a cylindrical photoconductor drum 102. The photoconductor drum 102 is rotated at a speed equal to the printing speed. The surface of the photoconductor on the rotating photoconductor drum 102 is uniformly charged by a charger 104. The optical writing head 100 applies light of a dot image to be printed onto the photoconductor, and neutralizes a charged portion where the light is applied to form a latent image. Subsequently, a developing device 106 applies toner to the photoconductor in accordance with the condition of the charged portion of the photoconductor. A transfer device 108 transfers the toner onto a sheet 112 fed from a cassette 110. The sheet 112 is heated by a fixing device 114 so that the toner is fixed onto the sheet 112, and is conveyed to a stacker 116. After the toner has been transferred, the entirety of the charged portion of the photoconductor on the photoconductor drum 102 is neutralized by an erase lamp 118, and the residual toner is removed by a cleaner 120. The optical writing head 100 may be used in a printer or any other image forming apparatus such as a facsimile machine or a copying machine.

While exemplary embodiments of the present invention have been described in detail, the present invention is not limited to a specific exemplary embodiment, and a variety of modifications and changes may be made without departing from the scope of the present invention as defined in the appended claims.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting element comprising:
   a semiconductor substrate; and
   an island structure formed on the semiconductor substrate, the island structure including
      a light-emitting thyristor including stacked semiconductor layers having a pnpn structure, the pnpn structure having an anode layer provided on the semiconductor substrate, a n-type gate layer provided on the anode layer, a p-type gate layer provided on the n-type gate layer, and a cathode layer provided on the p-type gate layer, and
      a current confinement structure,
      the current confinement structure being provided in the anode layer and including a high-resistance region and a conductive region, and confining carriers in the conductive region; and
      wherein the anode layer comprises a first anode layer and a second anode layer, and the current confinement structure is provided between the first anode layer and the second anode layer, wherein the current confinement structure is provided directly below the first anode layer, and wherein the current confinement structure is provided directly above the second anode layer.

2. The light emitting element according to claim 1, wherein the high-resistance region is an oxidation region that is formed by selectively oxidizing the current confinement structure from at least one side surface of the island structure.

3. The light emitting element according to claim 1, wherein the current confinement structure is a semiconductor layer including p-type Al.

4. The light emitting element according to claim 2, wherein the current confinement structure is a semiconductor layer including p-type Al.

5. The light emitting element according to claim 1, wherein the current confinement structure is formed of p-type AlAs or AlGaAs, and
   the high-resistance region is an oxidation region of AlAs or AlGaAs.

6. The light emitting element according to claim 1, wherein the island structure further includes a shifting-unit thyristor including the semiconductor layers having the pnpn structure on the semiconductor substrate, and
   the shifting-unit thyristor has a top cathode layer which is separate from a top cathode layer of the light-emitting thyristor, and a gate which is also shared by the light-emitting thyristor.

7. The light emitting element according to claim 6, wherein the conductive region of the current confinement structure is formed directly below the cathode layer of the shifting-unit thyristor.

8. The light emitting element according to claim 5, wherein the island structure further includes a diode and a parasitic thyristor immediately below the diode, the diode being formed by a top pn layer in the pnpn structure on the semiconductor substrate, the parasitic thyristor including the semiconductor layers having the pnpn structure on the semiconductor substrate,
   the parasitic thyristor has a top cathode layer which is separate from the cathode layer of the light-emitting thyristor and the cathode layer of the shifting-unit thyristor, and
   the high-resistance region of the current confinement structure is formed directly below the cathode layer of the parasitic thyristor.

9. The light emitting element according to claim 1, wherein the island structure further includes a diode and a parasitic thyristor immediately below the diode, the diode being formed by a top pn layer in the pnpn structure on the semiconductor substrate, the parasitic thyristor including the semiconductor layers having the pnpn structure on the semiconductor substrate,
   the parasitic thyristor has a top cathode layer which is separate from the cathode layer of the light-emitting thyristor and the cathode layer of the shifting-unit thyristor, and
   the high-resistance region of the current confinement structure is formed directly below the cathode layer of the parasitic thyristor.

10. The light emitting element according to claim 8, wherein
    the parasitic thyristor includes a diode formed by a pn junction with the top cathode layer of the parasitic thyristor,
    the diode has an anode electrode formed on a p-type semiconductor layer, and a cathode electrode formed on the cathode layer, and
    the anode electrode of the diode serves as a gate electrode which is shared by the light-emitting thyristor and the shifting-unit thyristor.

11. The light emitting element according to claim 8, wherein
    an area ratio of the high-resistance region in the current confinement structure to the cathode layer of the parasitic thyristor when the cathode layer overlaps the high-resistance region is larger than an area ratio of the high-resistance region in the current confinement structure to the top cathode layer of the shifting-unit thyristor when the cathode layer overlaps the high-resistance region, and is larger than an area ratio of the high-resistance region in the current confinement structure to the top cathode layer of the light-emitting thyristor when cathode layer overlaps the high-resistance region.

12. The light emitting element according to claim 9, wherein
an area ratio of the high-resistance region in the current confinement structure to the top cathode layer of the parasitic thyristor when the cathode layer overlaps the high-resistance region is larger than an area ratio of the high-resistance region in the current confinement structure to the top cathode layer of the shifting-unit thyristor when the cathode layer overlaps the high-resistance region, and is larger than an area ratio of the high-resistance region in the current confinement structure to the top cathode layer of the light-emitting thyristor when cathode layer overlaps the high-resistance region.

13. The light emitting element according to claim 8, wherein
the island structure further includes a groove formed adjacent to the cathode layer of the parasitic thyristor and extending parallel to the cathode layer of the parasitic thyristor,
the groove has a depth that reaches at least the current confinement structure, and
the current confinement structure is exposed on a side surface of the island structure by the groove, and is selectively oxidized from the side surface.

14. The light emitting element according to claim 13, wherein
the island structure is divided into a first island structure and a second island structure by the groove, the first island structure having an anode electrode of the diode, the second island structure having a gate electrode which is shared by the light-emitting thyristor and the shifting-unit thyristor.

15. The light emitting element according to claim 8, wherein
the high-resistance region is formed entirely directly below the cathode layer of the parasitic thyristor.

16. The light emitting element according to claim 9, wherein
the high-resistance region is formed entirely directly below the cathode layer of the parasitic thyristor.

17. A self-scanning light emitting element array comprising:
a plurality of light emitting elements each being the light emitting element according to claim 8, wherein
a first transfer signal is applied to the cathode layer of the shifting-unit thyristor of an island structure located at an odd-number position among the island structures in the plurality of light emitting elements, and a second transfer signal different from the first transfer signal is applied to the cathode layer of the shifting-unit thyristor of an island structure located at an even-number position among the island structures in the plurality of light emitting elements, and
the gates of the shifting-unit thyristors of adjacent island structures among the island structures in the plurality of light emitting elements are electrically connected to each other via the diodes.

18. An optical writing head comprising the light emitting element array according to claim 17.

19. An image forming apparatus comprising the optical writing head according to claim 18.

20. A light emitting element comprising:
a semiconductor substrate; and
an island structure formed on the semiconductor substrate, the island structure including
a light-emitting thyristor including stacked semiconductor layers having a pnpn structure, the pnpn structure having an anode layer provided on the semiconductor substrate, a n-type gate layer provided on the anode layer, a p-type gate layer provided on the n-type gate layer, and a cathode layer provided on the p-type gate layer, and
a current confinement structure,
the current confinement structure being provided in the anode layer and including a high-resistance region and a conductive region, and confining carriers in the conductive region; and
wherein the anode layer comprises a first anode layer and a second anode layer, and the current confinement structure is provided between the first anode layer and the second anode layer, wherein the first anode layer has a bottom surface in direct contact with the current confinement structure, and wherein the second anode layer has a top surface in direct contact with the current confinement structure.

* * * * *